United States Patent [19]

Ebner et al.

[11] Patent Number: 5,362,806
[45] Date of Patent: Nov. 8, 1994

[54] TOUGHENED PHOTOCURABLE POLYMER COMPOSITION FOR PROCESSIBLE FLEXOGRAPHIC PRINTING PLATES

[75] Inventors: Cynthia L. Ebner, Mt. Airy; Srinivas K. Mirle, Ellicott City, both of Md.

[73] Assignee: W. R. Grace & Co.-Conn., New York, N.Y.

[21] Appl. No.: 1,363

[22] Filed: Jan. 7, 1993

[51] Int. Cl.$^5$ ............................................. C08L 51/04
[52] U.S. Cl. ............................................ 525/74; 525/73; 525/77; 525/79; 525/80; 525/207; 525/217; 525/222; 525/223; 522/111; 430/281; 430/286
[58] Field of Search ........................ 525/73, 74, 70, 77, 525/79, 80; 430/286, 281, 270, 300, 910, 913, 287; 522/40, 43, 46, 63, 64, 111, 149, 159, 134

[56] References Cited

U.S. PATENT DOCUMENTS

| | | | |
|---|---|---|---|
| 2,760,863 | 8/1956 | Plambeck, Jr. | 430/306 |
| 4,023,973 | 5/1977 | Imaizumi et al. | 430/286 |
| 4,272,608 | 6/1981 | Proskow | 430/288 |
| 4,442,302 | 4/1984 | Pohl | 522/103 |
| 4,478,931 | 10/1984 | Fickes et al. | 430/309 |
| 4,504,635 | 3/1985 | Weber, Jr. et al. | 525/450 |
| 4,507,382 | 4/1985 | Rousseau et al. | 430/275 |
| 4,517,279 | 5/1985 | Worms | 430/286 |
| 4,621,044 | 11/1986 | Fujikawa | 430/281 |
| 4,743,643 | 5/1988 | Buter | 524/396 |
| 4,762,892 | 8/1988 | Koch et al. | 525/279 |
| 4,791,189 | 12/1988 | Yu | 307/362 |
| 4,857,434 | 8/1989 | Klinger | 430/286 |
| 4,916,045 | 4/1990 | Koch et al. | 430/270 |
| 4,983,689 | 1/1991 | Yu | 525/412 |
| 5,047,313 | 9/1991 | Nebe et al. | 430/281 |
| 5,102,773 | 4/1992 | Littman et al. | 430/283 |
| 5,143,819 | 9/1992 | Mirle et al. | 430/286 |

FOREIGN PATENT DOCUMENTS 57-23693  2/1982  Japan .

*Primary Examiner*—James J. Seidleck
*Assistant Examiner*—M. L. Warzel
*Attorney, Agent, or Firm*—Valerie E. Looper; Mary Ann Capria; Bharat C. Gandhi

[57] ABSTRACT

An aqueous-developable article is made from a photosensitive prepolymer made by reacting together (a) maleated alkadiene polymer or copolymer, (b) hydroxyalkyl(meth)acrylate or hydroxy(polycaprolactone)acrylate, (c) polybutadiene diol or polyisoprene diol, and (d) monohydroxy-terminated thermoplastic polymer, such as monohydroxy-terminated polystyrene or monohydroxy-terminated polymethylmethacrylate, followed by hydrolysis and at least partial neutralization by reaction with a base, e.g. NaOH, to form an ionomer. When formulated with photoinitiator and (optional) unsaturated monomers, the ionomer is particularly useful in making photopolymer-based flexographic printing plates.

12 Claims, 1 Drawing Sheet

TOUGHENED PHOTOCURABLE POLYMER COMPOSITION FOR PROCESSIBLE FLEXOGRAPHIC PRINTING PLATES

FIELD OF THE INVENTION

This invention relates to radiation curable prepolymers and formulations or compositions containing the same, as well as radiation sensitive articles having solid layers prepared from such prepolymers or formulations. The invention also relates to processes for making and using the prepolymer or composition to form the radiation sensitive articles.

BACKGROUND OF THE INVENTION

Photocurable prepolymers and compositions are well known in the art for forming printing plates and other radiation sensitive articles. In the field of flexographic printing plates, the plates typically comprise a support and a photosensitive layer prepared from the photocurable composition. Additional layers on the plate include slip and release films to protect the photosensitive surface. Prior to processing the plate, the additional layers are removed, and the photosensitive layer is exposed to radiation in an imagewise fashion. The unexposed areas of the layer are then removed in developer baths.

Removal of unexposed layers comprising photocurable compositions such as those disclosed in U.S. Pat. No. 2,760,863 require the use of developer baths comprising environmentally unsafe, organic solvents such as tetrachloroethylene, perchloroethylene, 2-butanone, benzene, toluene, xylene, trichloroethane and solvent mixtures such as tetrachloroethylene/n-butanol. However, due to the toxicity, high volatility and low flash point, their use gives rise to hazardous conditions and creates pollution problems. Thus, recently there has been a strong interest in the field to develop photosensitive layers in non-organic solvent developing solutions, e.g. aqueous or alkaline-aqueous solutions. However, the compositions resulting from recent attempts to achieve aqueous developable plates demonstrate deficiencies in mechanical properties or are unsuitable for use with a wide variety of printing inks, especially alcohol based inks.

For instance, in addition to possessing an aqueous developable photosensitive layer, a flexographic printing plate must have sufficient flexibility to wrap around a printing cylinder, yet be strong enough to withstand the rigors experienced during typical printing processes. Further, the printing plate should be soft enough to facilitate ink transfer during printing.

Previous aqueous developable compositions have not possessed all the desirable features such as flexibility, softness and solvent resistance to inks typically used in printing. For example, water-developable photosensitive compositions which contain as the main component a high molecular weight polymer such as polyvinyl alcohol, cellulose, polyethylene oxide, or the like, are insufficient in flexibility and rubber hardness and hence are unsuitable for use in flexographic printing plates.

Finally, it is also important that the photosensitive layer of the printing plate be dimensionally stable during storage. For example, some compositions used for making plates have shown inferior stability properties when used in solid flexographic printing plates in that the compositions become tacky and pasty during storage. Those inferior properties have been attributed to the low molecular weight of the polymers used to prepare the printing plates. See Koch et al. U.S. Pat. No. 4,762,892 infra and discussion of low molecular weight polymers disclosed in Japanese Kokoku 57-23693.

One attempt to develop an aqueous developable, flexible printing plate is illustrated in Koch et al. U.S. Pat. No. 4,916,045. The patent describes a photosensitive recording element consisting primarily of an ionic polymer. The ionic polymer is prepared by the partial esterification or amidation of succinic acid anhydride side groups on an alkadiene polymer. The resultant polymer is then converted into an ionic polymer by reaction with suitable compounds. With reference to the preferred materials, the reference is directed to oligomers having a polybutadiene backbone, side radicals prepared by (a) maleating the polybutadiene, (b) esterifying the resultant pendent succinic anhydride ring with hydroxyethylmethacrylate (HEMA), and (c) neutralizing the carboxyl groups generated during the esterification with a cation from Groups I to V of the Periodic Table. The polymer is not chain-extended with, e.g., polybutadiene diol, or reacted (toughened) with, e.g., monohydroxy-terminated polystyrene.

Imaizumi et al., U.S. Pat. No. 4,023,973, Photosensitive Composition Using Maleic Anhydride adduct of a 1,2 Polybutadiene (1977), discloses photosensitive compositions for use on flexographic printing plates developable in water. The compositions comprise the maleic anhydride adduct of 1,2 polybutadiene, photosensitizer, and acrylate extenders. The adduct may be hydrolized to open the anhydride rings, and the product may be neutralized with a base. The adduct is not chain extended, nor is any styrene polymer used. The 1,2- content of the material, 70% or more, gives the composition an undesirably high rubber hardness.

Stephen Proskow U.S. Pat. No. 4,272,608, Photosensitive Compositions Containing Thermoplastic Ionomeric Elastomers Useful in Flexographic Printing Plates (1981) discloses a photosensitive composition useful in flexographic printing plates. The composition comprises a maleated butadiene-acrylonitrile copolymer which can be reacted with a (meth)acrylate. The plate can be developed in water containing sodium carbonate.

Fickes et al. U.S. Pat. No. 4,478,931, Precured Flexographic Printing Plate (1984), discloses a photopolymer prepared by mixing a carboxyl-containing butadiene-acrylonitrile block copolymer with an acrylate. The carboxyl groups may come from maleic anhydride. Hydroxy-alkyl(meth)acrylates are not disclosed. The butadiene may contain styrene groups in the form of a block copolymer, not reacted with maleic groups as in the instant invention. The polymer is not chain-extended. The photopolymer may be used in a water-developable printing plate.

Other attempts to make aqueous developable printing plates include:

Rousseau et al. U.S. Pat. No. 4,507,382, Water Developable Positive Acting Lithographic Printing Plate (1985) discloses a water developable lithographic printing plate using a photopolymerizable composition comprising an ethylenically unsaturated dextrin oligomer and a hydroxy acrylamide.

J. R. Worns U.S. Pat. No. 4,517,279, Photosensitive Elastomeric Polymer Composition for Flexographic Printing Plates Processable in Semi-Aqueous Basic Solution or Solvent Systems (1985), discloses a photosensitive composition comprising a mixture of carboxylated and non-carboxylated butadiene/acrylonitrile copolymers. Plates made with the composition were developed in semi-aqueous, e.g., alkanol/water solutions.

J. Fujikawa U.S. Pat. No. 4,621,044, Photosensitive Polymer Composition(1986), discloses a water developable printing Plate using polyvinylacetate as base polymer.

Lori J. Klinger U.S. Pat. No. 4,857,434, Radiation Curable Liquid (Meth)Acrylated Polymeric Hydrocarbon Maleate Prepolymer and Formulations Containing Same (1989), discloses methacrylation of a maleated hydrocarbon, e.g., polybutadiene for the preparation of a photopolymer useful in water-developable flexographic printing plates.

Nebe et al. U.S. Pat. No. 5,047,313, Photosensitive Semi-aqueous Developable Copper Conductor Composition (1991) discloses a flexographic printing plate requiring some organic solvent (e.g., butyl cellosolve) for development. The plate has a photosensitive component comprising glass frit, acrylate binder, and acrylate monomer.

OBJECTS OF THE INVENTION

It is an object of the invention to prepare novel photocurable compositions which are suitable for use in an aqueous developable, photosensitive layer on a flexible photosensitive article such as a flexible printing plate.

It is also an object of the invention to prepare a flexible photosensitive article comprising the novel compositions.

It is an object of the invention to prepare a solid, photosensitive layer which is flexible, yet strong and durable.

It is also an object to prepare a solid photosensitive layer which when cured in an imagewise pattern results in a relief pattern layer which easily transfers ink in instances where the layer is that of a flexible printing plate.

It is a further object of the invention to provide a novel photocurable composition possessing the aforementioned properties, the photocurable composition comprising an ionic prepolymer (ionomer) derived from a chain-extended maleic anhydride adduct of a base polymer preferably a polybutadiene or butadiene copolymer wherein a significant degree of the segments of the base polymer has a 1,4 microstructure, the prepolymer being further toughened by reaction with a monohydroxy-terminated thermoplastic polymer such as monohydroxy-terminated polystyrene and/or monohydroxy-terminated polymethylmethacrylate.

It is yet another object of the invention to provide a novel process for preparing a flexible, solid photosensitive layer, the process comprising:

(a) reacting anhydride groups, of a maleic anhydride adduct of base polymer wherein a significant degree of the base polymer's segments have a 1,4 microstructure, with a reagent having an olefinically unsaturated group and an anhydride reactive group; where, upon reaction of the reagent with a portion of the adduct's anhydride groups, the anhydride groups are opened and an olefinically unsaturated side chain attached and a carboxylic acid group is formed;

(b) chain-extending the adduct by reacting a polymeric alkadiene diol with unreacted anhydride groups from (a) to increase the number average molecular weight ($M_n$) of the thus chain-extended polymer;

(c) reacting the polymer with a monohydroxy-terminated polymer;

(d) reacting the remaining unreacted anhydride groups from (a), (b), and (c) with water to form more carboxylic acid groups;

(e) neutralizing a portion or all of the carboxylic acid groups in (d) with a base to form an ionomer; and (f) applying the product in (e) as a layer on a support to form a flexible photosensitive article. The process can also comprise adding photocurable unsaturated monomers and photoinitiators to the product of (e).

THE DRAWING

The FIGURE is a simplified schematic flow diagram showing a preferred embodiment of the invention and indicating structures of certain initial, intermediate, and final products. Maleated polybutadiene is reacted simultaneously with (b) hydroxyethylmethacrylate, (c) a polyalkadiene diol, and (d) monohydroxy-terminated polystyrene or monohydroxy-terminated poly(methylmethacrylate). In (b) and (d) the reagents open the maleate rings and form side chains. In (c) the diol opens maleate rings of different molecules of maleated polybutadiene (chain extension). The result is hydrolyzed in (e), whereby the remaining maleate rings are opened with formation of carboxyl groups. In the final step (f) the hydrolyzed product is treated with NaOH to form an ionomer, useful in making flexographic relief printing plates.

Various alternate reactants are possible in the several stages of the process, as described in more detain herein.

SUMMARY OF THE INVENTION

The novel photocurable prepolymer of the invention is prepared by reacting together:
1. Maleated polybutadiene and/or maleated butadiene copolymer (e.g., butadiene/styrene copolymer);
2. Hydroxyalkyl(meth)acrylate or hydroxy(polycaprolactone) acrylate;
3. Polymeric alkadiene polyol chain extender, e.g., polybutadiene diol and/or polyisoprene diol;
4. Monohydroxy-terminated thermoplastic polymers, e.g. monohydroxy-terminated polystyrene and monohydroxy-terminated polymethylmethacrylate.

Following the above reaction the product can be at least partially hydrolyzed and neutralized.

The idealized structure of the resulting product or prepolymer is made of segments of the structure

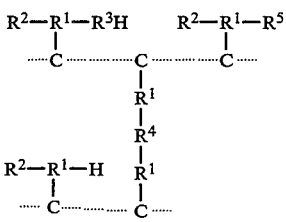

Where
... C ... represents the backbone chain of a base polymer, which is a butadiene polymer or copolymer;
$R^1$ is a maleic anhydride residue;
$R^2$ is H, Na, Li, or K;
$R^3$ is a thermoplastic polymer such as polystyrene or poly(methyl)methacrylate;
$R^4$ is polybutadiene or polyisoprene;
$R^5$ is an alkyl acrylate or methacrylate or a low molecular weight polycaprolactone acrylate.

The at least partially neutralized prepolymer (ionomer) can be formulated to prepare a flexible printing plate.

Molecular weights are number average, $M_n$, determined by GPC using polystyrene standards.

Weights are weight percents unless otherwise stated.

DETAILED DESCRIPTION OF THE INVENTION

The Overall Reaction

Figure 1:
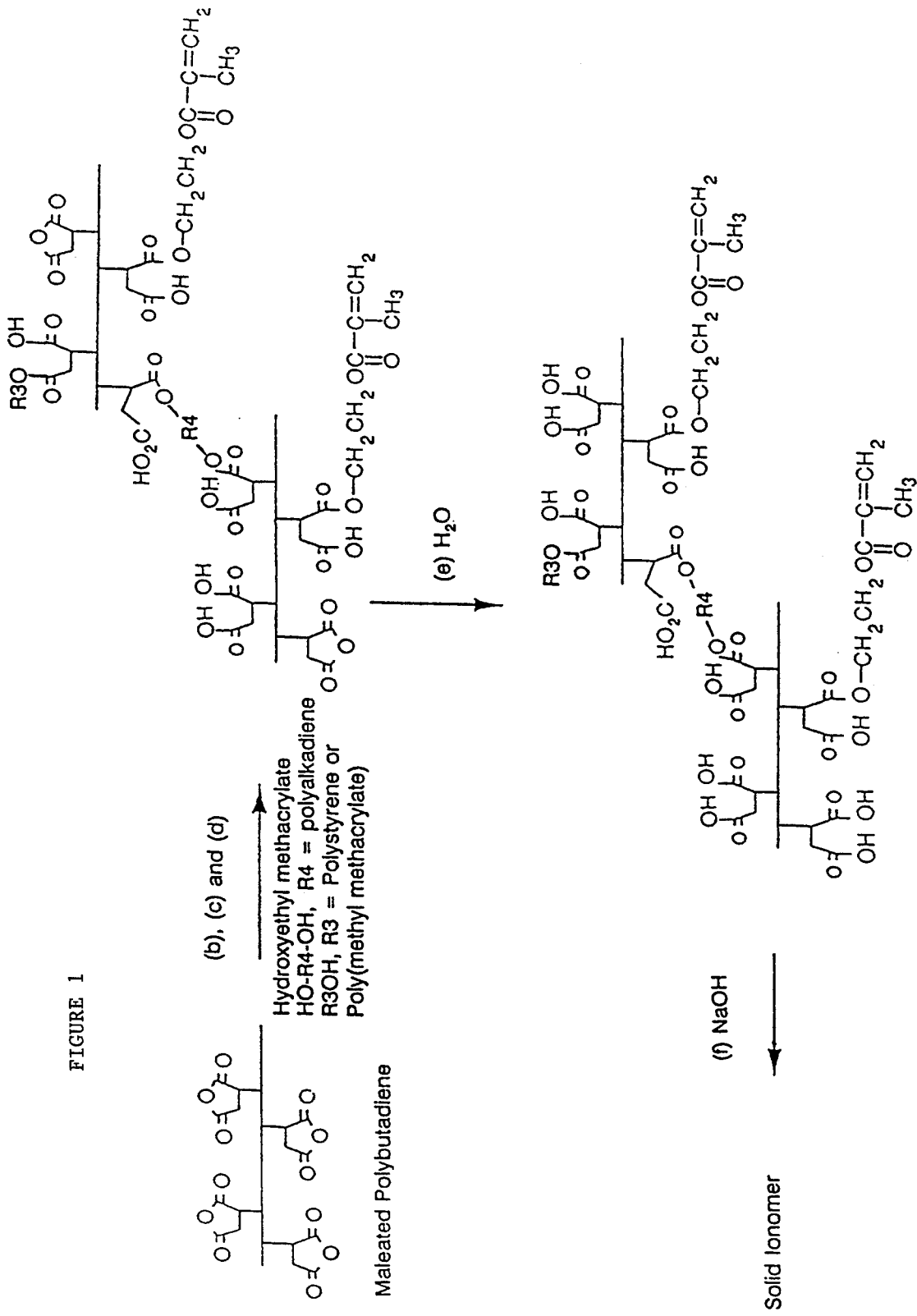

Using four specific reagents within the invention, the reaction of maleated polybutadiene, hydroxyethylmethacrylate (HEMA), polyalkadiene diol, and monohydroxy-terminated thermoplastic polymer, such as mono-hydroxy-terminated polystyrene gives a prepolymer.

In this reaction HEMA may be substituted in whole or in part by other hydroxyalkyl(meth)acrylates or by hydroxy(polycaprolactone)acrylate as herein described. Further, monohydroxy-terminated polystyrene may be substituted in whole or in part by monohydroxy-terminated polymethylmethacrylate.

Carboxyl groups on the opened maleic anhydride molecules may be neutralized by a base such as NaOH, whereby the carboxyl hydrogen is replaced by $Na^+$ or other base anion. When the neutralization is conducted in an alcohol (e.g., ethanol), some of the maleic carboxyl may be esterified by the alcohol.

The backbone chain of the base polymer can be polybutadiene, a butadiene copolymer, (e.g., butadiene/styrene) or blends thereof. The base polymer in either case has at least 60%, preferably at least 70%, 1,4 microstructure.

In this synthesis positioning of substituents is not critical, and statistically speaking chain-extension and/or cross-linking will be largely random, between the same or different groups.

In addition to the groups and substituents discussed above, it will be evident that other maleic anhydride groups on the base polymer backbone will be similarly opened and reacted. Again, formation of such substituents along the base polymer chain is random. For example, three adjacent $R^1$, or maleic anhydride groups, may be opened by monohydroxy polystyrene, and the next three left unreacted by anything. Also, the chain extending diol may react with several $R^1$'s or maleic anhydrides in two separate base polymer chains, and with none in other base polymer chains.

Placement of substituents on the base polymer molecules is thus a statistical average. Some base polymer molecules may have all acrylate esters and no monohydroxy-terminated polystyrene, while others may have all the latter and none of the former, and still others may go through the entire reaction process prior to hydrolysis without opening their anhydride groups. Further, some base polymer molecules may be chain-extended to unusual lengths and others very little or not at all. Also, it is believed that reaction of a substituent with a maleic anhydride group may occur on either "arm" of the opened molecule, i.e., randomly on either of the two carbonyls.

As above indicated, the HEMA (or alternate hydroxy acrylate) opens the maleic anhydride group, esterifying one of the carbonyls and converting the other to carboxylic acid, —COOH. During the same reaction, a molecule of the chain-extending diol opens anhydride groups on two or more molecules of the maleated butadiene polymer and forms —C(:O)O—R⁴—OC(:O)— linkages, where $R^4$ represents the butadiene base polymer and where the carbonyls derive from residual maleic (succinic) anhydride moieties. Two or more chain-extending diols may link any two given maleated base polymer molecules; on the other hand it is expected that some maleated base polymers will escape the chain-extending reaction. The monohydroxy-terminated thermoplastic polymer HO—R³H reacts at random with maleic (succinic) anhydride groups, opening the ring with formation of the corresponding ester. The reaction increases the toughness of the polymer.

The product of the reaction may be reacted with water. This results in hydrolysis of the remaining succinic (maleic) anhydride groups. At this stage the product comprises copious —COOH groups and little or no anhydride groups. The hydrolyzed product can be treated with a base, e.g., NaOH, to neutralize some or all of the —COOH groups and so produce the final ionomer product. The ionomer can be formulated with photoinitiators, (optional) photosensitive additives such as acrylates, inert particulate fillers and coloring agents such as pigments and dyes, and may be solvent casted on a support as explained hereinafter.

The reagents and sub-reactions will be considered below.

(a) The Maleated Base Polymer

The photocurable or photosensitive composition (the term "photocurable" and "photosensitive" being used interchangeably throughout) can be a prepolymer derived from a maleic anhydride adduct of polybutadiene having at least about 60 to 80% 1,4 microstructure. As discussed later, the photocurable composition preferably comprises additional photocurable compounds such as unsaturated monomers. "Maleic anhydride" includes substituents as hereinafter discussed.

The term 1,4 microstructure refers to the butadiene segment's structure which results from 1,4 addition to a 1,3 butadiene monomer during polymerization. The general structure for a 1,4 polybutadiene is illustrated below:

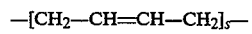

wherein s is a integer depending on the amount of polymerization desired and the molecular weight of the polymer. The remaining percentage of butadiene segments have a 1,2 microstructure which results from 1,2 addition during polymerization. In instances where butadiene segments having 1,2 microstructure are present, the polybutadiene has pendent vinyl groups on its structure, as illustrated below:

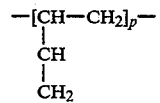

wherein p is a positive integer depending on the amount of polymerization and the molecular weight of the polymer. The formation of the 1,4 microstructure is dependent upon reaction conditions used during the polymerization reaction and can be regulated by known techniques.

For instance, the choice of catalyst or promoter, variation in the polarity of solvents used, variations in the reaction temperatures and the presence of transition metals all influence the 1,4 content of the resulting polymers' microstructure. In general, a polymer having increased 1,4 content will lead to higher elasticity and an increase in the rubbery nature of the composition. It is believed that those properties can be attributed to less crosslinking between pendent vinyl groups which are present on the polybutadienes which have a higher degree of 1,2 microstructure.

The adduct can have a maleic anhydride content of from 5-30 percent by weight of the adduct and preferably contains about 8-20% by weight. The number of maleic anhydride groups per base polymer molecule varies and depends on the molecular weight of the polymer and the degree of maleation. The adduct Lithene ® LX16-10MA in Example 2 below has about 8 groups for 8800 molecular weight. The groups are grafted on the base polymer chain. Lower amounts of anhydride content decrease the aqueous developability of the photocurable composition, and layers made therefrom, while higher amounts causes the composition and layers therefrom to be hard and less flexible.

The addition of the maleic anhydride to the polybutadiene can be accomplished by reacting the polybutadiene with a maleic anhydride of the general formula

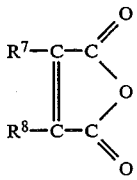

wherein $R^7$ and $R^8$ are individually a member of the group consisting of hydrogen, halogen, carboxyl, linear or cyclic alkyl containing 1-20 carbon atoms, aryl, alkaryl and aralkyl containing 6 to 20 carbon atoms.

For example, the adduct can be formed by heating the polybutadiene and the maleic anhydride to about 220° C., with stirring in a halogenated aromatic hydrocarbon solvent, such as α-chloronapthalene. The reaction can be carried out in the presence of an inhibitor so as to prevent side reactions. Suitable inhibitors include copper, copper salts and copper chelate complexes. The maleic anhydride can be added in any proportion from a minimum of 5% by weight up to 30% by weight, with the percentage of bonded maleic anhydride preferably being between 8 and 20% by weight. The molecular weight of the adduct can be between 1000 and 20,000 number average and is preferably 4,000 to 20,000. Other known techniques of adding maleic anhydride can be used. See U.S. Pat. No. 3,974,129 contents of which are incorporated herein by reference. See also W. Cloak, *Industrial Engineering Chemistry*, Vol. 4, p.2095 (1955). Commercially available maleic anhydride adducts of 1,4 polybutadiene include a material designated as LX16-10MA from Revertex Ltd. and a material designated as Ricon 131 MA from Ricon Resins Inc.

The adduct may also comprise a base polymer which is a butadiene copolymer with styrene, acrylonitrile, chloroprene, isobutylene, propylene, ethylene, or acrylic and methacrylic acids and esters. In instances where a copolymer is used, at least about 60 to about 80% of the butadiene segments should have 1,4 microstructure. Commercially available maleic anhydride adducts of a butadiene copolymer with styrene include Ricon 184 MA from Ricon Resins Inc. A maleated butadiene/styrene copolymer containing about 2-25% (preferably about 20%) maleic anhydride, about 15-40% (preferably about 30%) styrene, and $M_n$ about 2,000-20,000 (preferably at least about 4,200) is especially useful.

A preferred base polymer maleic anhydride adduct is made from polybutadiene having a molecular weight of about 8800 and having about 8 anhydride groups per molecule. In preparing the maleic anhydride-base polymer, the maleic anhydride groups are converted to succinic anhydride groups. In this context the two terms may be used interchangeably.

(b) Esterification with Hydroxyalkyl(meth)acrylate or with Hydroxy(polycaprolactone)acrylate A portion of the adduct's anhydride groups is esterified with a reagent having an olefinically unsaturated group and a functional group which reacts with and opens the anhydride groups to form carboxylic acid and ester groups. Preferably, the reagent is a hydroxyalkyl(meth)acrylate of the structure [HO]—(CH$_2$)$_t$—O—(C:O)—C(R$^6$)=CH$_2$, wherein R$^6$ is hydrogen or methyl and t=2 to 4 and [HO] represents the anhydride reactive group. An example of a reagent having hydroxy as the anhydride reactive group is hydroxyethyl methacrylate (HEMA). An alternate is hydroxy(polycaprolactone acrylate, of the structure: H—[(OCH$_2$)$_5$—C(O:)—]$_2$—O—CH$_2$CH$_2$—O(C:O)CH=CH$_2$. It is available commercially as Tone ®M-100 from Union Carbide Company.

Hydroxy(polycaprolactone)acrylate can be prepared by reacting epsilon-caprolactone with hydroxyethylacrylate in a respective mole ratio of 2-3:1, in the presence of suitable catalysts and inhibitors. See Weber et al. U.S. Pat. No. 4,504,635, Example 1. Alternate methods are described in S. H. Yu U.S. Pat. Nos. 4,791,189 and 4,983,689.

The reaction of the four indicated components to form the invention polymer is carried out at temperatures from 50° to 120° C., preferably at about 70°-95° C., for 1 to 24 hours. The reaction is preferably carried out in an organic solvent in which the four indicated reagents are soluble. An organic solvent is desirable to facilitate formation of the high molecular weight and viscosity of the chain extended product.

The vinyl esterification reagent is added in amounts to react with 5 to 40% of the adduct's anhydride groups. In the case of hydroxyalkyl(meth)acrylate the esterification reaction creates pendent groups having the following structure P:

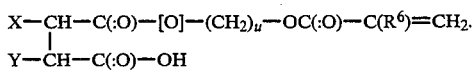

In the case of hydroxy(polycaprolactone)acrylate the esterification reaction creates pendent groups having the structure P':

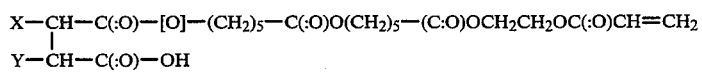

wherein, for both P and P' [O] is the oxygen linkage formed by the anhydride reactive group; X is a carbon of the base polymer chain and Y is H, or vice versa, u is 2–4, and $R^6$ is —H or —$CH_3$.

As illustrated above, the pendent groups P and P' provide photocurability to the polybutadiene adduct. When the adduct is exposed to UV radiation, the vinyl groups in P and P' crosslink, thus curing the composition and imparting tensile strength and modulus to any layer prepared from the composition, as well as imparting improved swell resistance of the polymer in solvents. Further, the esterification reaction opens the anhydride groups to form free carboxylic acid groups, thus providing a water dispersible composition which can be developed in aqueous or aqueous-alkaline solutions.

(c) Chain Extension with Polyalkadiene Diol

The adduct is chain extended to improve the physical properties, i.e., increase elongation and provide a stable and durable photosensitive surface. The chain extending agent $R^4$ is a polybutadiene diol or polyisoprene diol, has a molecular weight of about 1000–8000, preferably about 3,000–8,000 and preferably has about 70% 1,4 microstructure. Chain extension of the adducts occurs through a portion of the anhydride groups. Preferably, chain extension occurs through 5 to 30% of the adduct's original anhydride groups.

(d) Esterification with Monohydroxy-Terminated Polymer

Simultaneously with the esterification and chain extension reactions in (b) and (c) above, anhydride groups are being reacted with monohydroxy-terminated polymer, such as polystyrene, $M_n$ about 2,000–50,000, preferably about 5,000–30,000; or monohydroxy-terminated polymethyl-methacrylate, $M_n$ about 2,000– 50,000, preferably about 5,000–30,000. The addition of these blocks of thermoplastic polymer leads to an increase in polymer toughness, as measured by tear resistance, ASTM D-624-81.

Monohydroxy-terminated polystyrene can be made by the process described by Chien et al, "Efficient Syntheses of the Triblock Copolymer Styrene-b-Tetrahydrofuran-b-Styrene by Coupling of Preformed Blocks," Journal of Applied Polymer Science, vol 41, 775–782, especially 776–777 (1990). In this process, styrene is polymerized in cyclohexane under nitrogen in the presence of s-butyllithium. Ethylene oxide is added. After further reaction followed by removal of solvent and water, monohydroxy-terminated polystyrene is recovered.

Monohydroxy-terminated polymethylmethacrylate can be made by a similar process.

(e) Hydrolysis

To open the remaining anhydride groups the chain-extended product is reacted with water. This reaction produces additional carboxylic acid groups which when neutralized with monovalent cations as herein described, form a solid photopolymer and increases the water dispersibility of the photocurable composition.

(f) Neutralization

Finally, to provide the ionomer, at least some of the carboxyl groups in the maleic anhydride residues are neutralized by bases such as (but not limited to) lithium hydroxide, sodium hydroxide, or potassium hydroxide, or their respective methoxides, acetates, etc. It has been found that the resulting salts have improved physical properties such as higher resilience, higher elongation and better resistance to swell in organic solvents commonly used in printing inks.

Good results are obtained when about 40–80% of the carboxyls are neutralized. Forty to 60% is preferred.

Proportions

The relative proportions of ingredients in forming the photosensitive prepolymer require consideration, particularly for making flexographic relief printing plates. For example, too much HEMA results in a product too hard to make a printing plate flexible enough for this type of flexographic printing application. Too little hydrolysis of the remaining anhydride groups will yield a material which will not become a solid when neutralized with monovalent cations. Too little monohydroxy-terminated polystyrene or monohydroxy-terminated polymethylmethacrylate will give a product which "chips" i.e., tears easily, on press. However, too much of either of these latter materials will give a product too hard to make a good flexographic printing plate.

Based on 100 parts by weight of maleic anhydride adduct of base polymer (polybutadiene homo- or copolymer), of which 5–30, preferably 8–20 parts be weight is maleic anhydride moiety, we use (in parts by weight except as noted):

Hydroxyalkyl(meth)acrylate side chain additive, (e.g., HEMA), about 0.7–3.2, preferably 2.0–2.6;

Or, as an alternate to hydroxyalkyl(meth)acrylate, hydroxy(polycaprolactone)acrylate, about 2–15, preferably about 4–8;

Polyalkadienyl polyol chain extender (e.g., polybutadiene diol) about 10–63, preferably 30–50;

Monohydroxy-terminated polystyrene or monohydroxy-terminated polymethylmethacrylate, about 4–20, preferably about 5–10;

Li-, Na-, or K-containing base, sufficient to neutralize at least about 40%, preferably about 40–60%, of the carboxylic acid groups in the prepolymer, with formation of ionomer.

Physical Properties

To succeed commercially a flexographic printing plate should meet certain physical requirements, typically:

(1) Elongation (ASTM D 412) should exceed about 140.
(2) Tensile strength (ASTM D 412) should exceed about 300.
(3) Tear Resistance (ASTM D 624) should exceed 30 lb/in.
(4) Resilience (ASTM D 2632) should exceed 10%.
(5) Tensile modulus (1% elongation) (ASTM D 412) should not exceed about 2000.
(6) Shore hardness (ASTM 2240) should not exceed about 70.

Not every permutation of reagents and/or reaction conditions within the scope of the invention (using neutralization) will provide all of the optimum physical properties listed above. However, as noted in the Table, the conditions are met under preferred conditions.

As mentioned earlier, the photocurable compositions can also contain components in addition to the above described neutralized prepolymer. For instance, photocurable monomer diluents are suitably added. Operable diluents include reactive acrylic or methacrylic diluents of the formula

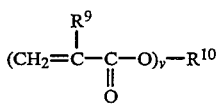

wherein $R^9$ is hydrogen or methyl, and $R^1$ is an organic moiety having the valence of v, and v is 1 or more. Such reactive acrylic diluents include, but are not limited to, trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol-200 diacrylate, tetraethylene glycol diacrylate, triethylene glycol diacrylate, pentaerythritol tetraacrylate, tripropylene glycol diacrylate, ethoxylated bisphenol-A diacrylate, trimethylolpropane triacrylate, di-methylolpropane tetraacrylate, triacrylate of tris(hydroxyethyl) isocyanurate, dipentaerythritol hydroxypentaacrylate, pentaerythritol triacrylate, ethoxylated trimethylolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate, 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate, polybutadiene diacrylate and the like which can be added to the composition. Monoacrylates such as cyclohexyl acrylate, isobornyl acrylate, lauryl acrylate, dicyclopentenyloxyethyl acrylate and tetrahydrofurfuryl acrylate and the corresponding methacrylates are also operable as reactive diluents.

Other suitable diluents include polymerizable ethylenically unsaturated addition monomers described in U.S. Pat. No. 4,442,302, contents of which are incorporated herein by reference. Those monomers include monofunctional, difunctional or polyfunctional compounds based on moieties such as (meth)acrylonitriles and acrylamides, as well as the (meth)acrylics described above.

Suitable photoinitiators for the photocurable composition include benzoin alkyl ethers, such as benzoin methyl ether, benzoin ethyl ether, benzoin isopropyl ether and benzoin isobutyl ether. Another class of photoinitiators are the dialkoxyacetophenones exemplified by 2,2-dimethoxy-2-phenylacetophenone, i.e., Irgacure ® 651 (Ciba-Geigy); and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to, benzophenone, acetophenone, o-methoxybenzophenone, acenaphthene-quinone, valerophenone, hexanophenone, alpha-phenyl-butyrophenone, p-morpholinopropiophenone, dibenzosuberone, 4-morpholinobenzophenone,4'-morpholinodeoxybenzoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracene-7-one, 1-naphthaldehyde, 4,4'-bis(dimethylamino)-benzophenone, fluorene-9-one, 1'-acetonaphthone, 2'-acetonaphthone, 2,3-butanedione, acetonaphthene, benz[a]anthracene 7.12 dione, etc. Phosphines such as triphenylphosphine and tri-o-tolylphosphine are also operable herein as photoinitiators. The photoinitiators or mixtures thereof are usually added in an amount ranging from 0.01 to 5% by weight of the total weight of the photocurable composition.

Other additives to the photocurable composition can be included. To inhibit premature crosslinking during storage of the prepolymer containing compositions of this invention, thermal polymerization inhibitors and stabilizers are added. Such stabilizers are well known in the art, and include, but are not limited to, hydroquinone monobenzyl ether, methyl hydroquinone, amyl quinone, amyloxyhydroquinone, n-butylphenol, phenol, hydroquinone monopropyl ether, phenothiazine and nitrobenzene, and mixtures thereof. Such additives are used in an amount within the range of from about 0.01 to about 2% by weight of the prepolymer. These stabilizers are effective in preventing crosslinking of the prepolymer composition during preparation, processing and storage.

The compositions also may contain up to about 50% by weight of an inert particulate filler which is essentially transparent to actinic light. Such fillers include the organophilic silicas, bentonites, silica, powdered glass and coloring agents such as dyes and pigments. Such fillers can impart desirable properties to the photocurable compositions and reliefs on printing plates containing those compositions.

The photocurable composition can then be shaped and formed as a solid layer of suitable thickness according to conventional solvent casting, i.e., dissolving the composition in a solvent, shaping the solution into a film or plate and removing the solvent. Conventional extrusion calendaring or hot press techniques can also be used. Solid layers of the photosensitive composition in the form of a film can be adhered to supports such as those comprising polyester, nylon or polycarbonate. Other suitable supports include woven fabrics and mats, e.g. glass fiber fabrics, or laminated materials made of, for example, glass fibers and plastics. It is preferred that the supports are dimensionally stable and resistant to the washout solutions.

It is necessary to protect photosensitive surfaces from contamination by dirt and dust during storage before being exposed and washed. Such protection is accomplished by lamination or application of a flexible protective cover sheet to the side of the photocurable composition opposite that of the support. As mentioned before the photocurable compositions can sometimes be tacky and it is desirable to apply a release film to the surface of the photosensitive layer before application of the coversheet. This release film may consist of a thin, flexible and aqueous dispersible polymeric film. This film allows for intimate contact between the surface of the photocurable composition opposite to the support and an image bearing negative applied to the surface.

Photosensitive articles made of a support with a solid layer of a photocurable composition such as solid flexographic printing plates, can then be processed by well known techniques. The photosensitive surface of the plate is exposed to actinic light through a negative. The light cures (hardens) the exposed areas of the surface. The negative is then removed and the uncured, unexposed areas of the surface are washed away. Preferably, the light should have a wavelength of from about 230–450 nm. Suitable sources of light include Type RS sunlamps, carbon arc lamps, xenon arc lamps, mercury vapor lamps, tungsten halide lamps and the like.

Exposure periods depend upon the intensity of the actinic light, thickness of the plate and the depth of the relief desired on the printing plate. Periods of from 2 to 20 minutes are preferred.

After exposure and the negative has been removed, the unexposed areas of the photosensitive surface can be developed in aqueous solutions. Suitable solutions include those of nonionic and cationic surfactants, as well as basic and semi-aqueous basic solutions and combinations thereof. Such surfactants are commercially available as Triton ® RW-150 from Union Carbide Company and Igepal ® C0-730 from GAF Corporation.

The following are examples illustrating the instant invention and are not intended to restrict the scope of the invention in any manner.

Certain of the reagents with their abbreviations used passim in the following examples are listed below.

Maleated polybutadiene, "MPB", $M_n$ 8800, 8 maleic groups per chain; as Revertex ® Lithene LX16-10MA from Revertex Ltd;

Hydroxy ethyl methacrylate, "HEMA";

Polybutadiene diol, 0.425 meq/g, "HTB" as Hycar ® HTB from B.F. Goodrich Company;

Ionol ®, 2,6-di-7-4-methylphenol, antioxidant;

Triton ® RW-150, an ethoxylated ($C_{12}$–$C_{14}$) t-alkylamine surfactant, from Union Carbide Company.

Monohydroxy-terminated polystyrene, "HTPS".

Monohydroxy-terminated polymethylmethacrylate, "HO-PMMA".

Monohydroxy-terminated(polycaprolactone)acrylate as Tone ® M-100 from Union Carbide Company.

Dicyclopentenyloxyethylmethacrylate, "DCPO-EMA".

Hexanedioldimethacrylate, "HDDMA".

EXAMPLE 1

Control (Not the Invention)

200 g of MPB, 4.85 g HEMA, 89 g HTB, 2.0 g Ionol ®, and 600 ml of toluene were charged into a 2L resin kettle equipped with a condenser, thermocouple and mechanical stirrer. The mixture was heated at 90° C. for 6 hours. At this point the temperature was lowered to 70° C., 150 g of toluene was added and stirring continued for 16 hours. 20 g of water was then added and stirring continued for 8 hours at which time an IR spectrum revealed a large amount of remaining anhydride. An additional 15 g water was added and stirring at 70° C. continued for 16 hours. Excess water was removed under a stream of nitrogen and the product cooled to room temperature.

A solution of 7.16 g sodium hydroxide in 83 g methanol was added with vigorous stirring to form the 60% neutralized ionomer. A solution of 3 g Irgacure ® 651 photoinitiator in 30 g toluene was then added with vigorous stirring. The product contained 31% polymer solids.

The product was solvent cast onto a polyester support to provide a solid photopolymer plate, which was exposed through a negative and developed in a 4% Triton ® RW-150 aqueous solution to yield a printing plate with good reproduction of the negative film image.

To test the physical properties of the photosensitive layer, a 20 mil film of the photocurable composition was prepared and cured. See the Table for properties. Swells, in water, aqueous ink, solvent based ink, 2-propanol, and 85% ethanol/15% ethylacetate were 7.1, 23.1, 12, 5.6 and 9.4% respectively.

EXAMPLES 2–12 (THE INVENTION)

EXAMPLE 2

Styrene Containing Polymer 200 g of MPB, 10.8 g of HTPS (11,500 Mw), dissolved in 100 g toluene, 4.85 g HEMA, 89 g HTB, 2.0 g Ionol ®, and 500 ml of toluene were charged into a 2L resin kettle and allowed to react as in Example 1.

A solution of 7.16 g sodium hydroxide in 83 g methanol was added with vigorous stirring to form the 60% neutralized ionomer. A solution of 3 g Irgacure ® 651 in 30 g toluene was then added with vigorous stirring. The product contained 30% polymer solids.

A photopolymer plate was prepared and cured as in Example 1. See the Table for test data.

Swells in water, aqueous ink, solvent based ink, 2-propanol, and 85% ethanol/15% ethylacetate were respectively 7.0, 24.7, 12.4, 6.0, and 9.5%.

The process of this Example makes a polymer with especially good physical properties for flexographic plate making, as compared with polymers made by the same process but omitting the monohydroxypolystyrene (Example 1).

EXAMPLE 3

200 g Of MPB, 4.86 g HEMA, 89 g HTB, 21.5 g HTPS (11,500 MW), 1000 ml toluene, and 1.0 g Ionol ® were charged into a 2L resin kettle and allowed to react as in Example 1.

To 99.0 g of the resulting polymer, 2.0 g sodium hydroxide dissolved in 25.3 g methanol, 6.2 g of DCPO-EMA, 9.1 g of HDDMA, and 1.2 g Irgacure ® 651 photoinitiator were added with stirring. The resultant 60% sodium neutralized material was solvent cast onto a polyester support to provide a solid photopolymer plate which was exposed through a negative and then developed in a 4% Triton RW-150 aqueous solution to yield a printing plate with good reproduction of the negative film image.

To test the physical properties of the photosensitive layer, a 20 mil file of the photocurable composition was prepared and cured. See the Table for properties. Swells in water, aqueous ink, solvent based ink, 2-proponal, and 85% ethanol/15% ethylacetate were 6.1, 12.4, 19.1, 6.1 and 8.8% respectively.

Other levels of neutralization and other formulations were prepared. See the Table for data.

EXAMPLE 4

A polymer was prepared and formulated as in Example 2 using 10.8 g HTPS (25,000 MW). See the Table for data. Swells in water, aqueous ink, solvent based ink, 2-propanol, and 85% ethanol/15% ethylacetate were 7.7, 22.7, 10.6, 5.0 and 7.6% respectively.

EXAMPLE 5

A polymer was prepared, formulated, and tested as in Example 2 using 21.6 g HTPS (25,000 MW). See the Table for data.

TABLE

Physical Properties

| Example | % HDDMA[1] | % DCPOEMA[2] | % CD-5000[3] | % DCPOEA[4] | % NaOH | Elong. % | Tensile PSI | Modulus PSI | Shore A | Resil. % | Tear Strength lb/in |
|---|---|---|---|---|---|---|---|---|---|---|---|
| 1 | 0 | 0 | 0 | 0 | 60 | 431 | 360 | 419 | 60 | 64 | 89 |
| 2 | 0 | 0 | 0 | 0 | 60 | 440 | 518 | 567 | 64 | 61 | 105 |
| 3 | 7.9 | 5.4 | 0 | 0 | 60 | 120 | 526 | 1350 | 78 | 50 | 65 |
| 3 | 2.0 | 10.0 | 2.0 | 0 | 45 | 305 | 591 | 524 | 69 | 45 | — |
| 3 | 0 | 0 | 0 | 0 | 60 | 437 | 334 | 260 | 58 | 61 | 106 |
| 4 | 0 | 0 | 0 | 0 | 60 | 410 | 350 | 349 | 56 | 50 | 117 |
| 5 | 0 | 0 | 0 | 0 | 60 | 436 | 304 | 293 | 46 | 51 | 39 |
| 6 | 2.0 | 3.0 | 0 | 0 | 60 | 304 | 337 | 400 | 65 | 50 | 87 |
| 6b | 0 | 0 | 0 | 0 | 0 | 179 | 95 | 115 | 10 | 26 | 29 |
| 6c | 0 | 0 | 0 | 0 | 60 | 410 | 340 | 398 | 62 | 51 | 85 |
| 6 | 0 | 0 | 0 | 5 | 60 | 323 | 412 | 531 | 62 | 48 | 74 |
| 7 | 0 | 0 | 0 | 0 | 0 | 191 | 71 | 130 | 11 | 23 | — |
| 7 | 0 | 0 | 0 | 0 | 60 | 559 | 305 | 527 | 61 | 51 | 43 |
| 7 | 2 | 3 | 0 | 0 | 60 | 322 | 330 | 495 | 64 | 48 | 43 |
| 8 | 0 | 0 | 0 | 0 | 60 | 387 | 288 | 349 | 54 | 47 | 63 |
| 8 | 2 | 3 | 0 | 0 | 60 | 261 | 242 | 387 | 60 | 44 | 66 |
| 9 | 0 | 0 | 0 | 0 | 60 | 304 | 336 | 489 | 60 | 48 | 39 |
| 10 | 0 | 0 | 0 | 0 | 60 | 254 | 359 | 664 | 64 | 48 | 60 |
| 11 | 0 | 0 | 0 | 0 | 60 | 387 | 292 | 550 | 60 | 53 | 66 |
| 12 | 0 | 0 | 0 | 0 | 60 | 298 | 166 | 571 | 56 | 45 | 30 |

Footnotes:
[1]Hexane dioldimethacrylate
[2]Dicyclopentenyloxyethylmethacrylate
[3]Polybutadiene diacrylate, $M_n$ 3000 (Sartomer)
[4]Dicyclopentenyloxyethylacrylate

EXAMPLE 6

Alternative Hydroxyacrylate: with Hydroxy-terminated Polystyrene 200 g of MPB, 4.33 g of hydroxyethylacrylate, 87.8 g HTB, 10.8 g HTPS (11,500 MW), 600 ml toluene and 1.0 g Ionol were charged into a 2L resin kettle, which was equipped with a condenser, thermocouple, and mechanical stirrer. The reaction mixture was heated 95° C. with stirring for 6 hours. At this point the temperature was lowered to 70° C. and an excess of water added (20 g). The reaction mixture was stirred overnight, i.e., 18 hours to react all the remaining anhydride groups.

Water was removed under a stream of nitrogen and the reaction mixture cooled to room temperature.

To 58.5 g of polymer solids was added 1.36 g sodium hydroxide in 15.6 g methanol, 1.24 g HDDMA, 1.87 g DCPOEMA and 0.6 g of Irgacure 651. The resultant 60% neutralized and formulated material was solvent cast, cured, and physical properties measured. See the Table.

Other formulations were likewise prepared. See the Table. The differences in physical properties resulting from the non-ionomer form of the polymer (Table, 6b) as against the ionomer form of the polymer (6c) are evident: all physical properties measured are significantly higher in the ionomer form.

EXAMPLE 7

Alternative Thermoplastic: HO-PMMA 200 g MPB (0. 932 meq/g), 87.7 g HTB, 7.65 g HEMA, 9.1 g HO-PMMA (6000 MW), 2 g Ionol, and 600 ml toluene were charged into a 2L resin kettle and reacted as in Example 6.

The polymer was neutralized to 60% using sodium hydroxide in methanol and formulated. See the Table. Other formulations were likewise prepared.

EXAMPLE 8

200 g MPB (0.932 meq/g), 87.8 HTB, 4.87 g HEMA, 18.2 g HO-PMMA (6000 MW), 2 g Ionol and 600 ml toluene were charged into a 2L resin kettle and reacted as in Example 1.

The resultant polymer was neutralized to 60% with sodium hydroxide in methanol and formulated with 1% Irgacure 651. See the Table for data.

EXAMPLE 9

Polybutadiene/styrene Copolymer (Control) Not the Invention 200 g Ricon ® 181MA10 maleated polybutadiene/styrene copolymer, having a MW of 4200 and 4 anhydride groups per chain (0.911 meq/g), 85.94 g Hycar ® HTB (0.425 meq/g), 4.76 g HEMA, 2 g Ionol and 500 ml toluene were charged into a 2 L resin kettle and reacted as in Example 6.

The resultant polymer was neutralized to 60% with sodium hydroxide in methanol and formulated with 1% Irgacure 651. Films were prepared and tested as in Example 1. See Table for data.

EXAMPLE 10

Polybutadiene/styrene Copolymer with HTPS 200 g Ricon ® 181MA10 (0.911 meq/g), 85.94 g Hycar ® HTB (0.425 meq/g), 4.76 g HEMA, 2 g Ionol, 10.8 HTPS (11,500 MW) and 500 ml toluene were charged into a 2L resin kettle and reacted and formulated as in Example 1. Films were prepared and tested as in Example 1. See Table for physical property data.

EXAMPLE 11

Use of Hydroxy-Terminated Polyisoprene, HTPI 200 g MPB (0.932 meq/g), 116.5 g HTPI (0.32 meq/g), 4.87 g HEMA, 10.8 g HTPS (11,500 MW), 2 g Ionol and 600 ml toluene were charged into a 2L kettle and reacted as in Example 1.

The resultant polymer was neutralized to 60% with sodium hydroxide in methanol and formulated with 1% Irgacure 651. Films were prepared and tested as in Example 1. See Table for data.

EXAMPLE 12

Use of Tone M-100

200 g MPB (0.932 meq/g), 87.8 g HTB, 12.82 g Tone M-100 (2.907 meq/g), 10.8 HTPS, 2 g Ionol and 600 ml toluene were charged into a 2L resin kettle and reacted as in Example 1.

The resultant polymer was neutralized to 60% with sodium hydroxide in methanol and formulated with 1% Irgacure 651. Films were prepared and tested as in Example 1. See Table for data.

What is claimed is:

1. A prepolymer comprising segments of the structure

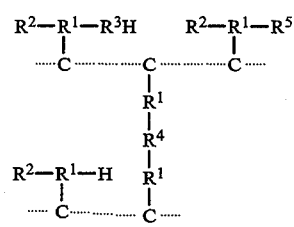

... C ... represents the backbone chain of a base polymer, which is a butadiene polymer or copolymer with at least 60% 1,4 microstructure;

$R^1$ is a maleic anhydride residue;

$R^2$ is H, Na, Li, or K;

$R^3$ is derived from a thermoplastic polymer comprising polystyrene having a number average molecular weight of about 5,000 to 30,000 or poly(methyl methacrylate) having a number average molecular weight of about 5,000 to 30,000;

$R^4$ is derived from a hydroxy-terminated polybutadiene having a molecular weight of about 800 to 9,000 or a hydroxy-terminated polyisoprene having a number average molecular weight of about 1,000 to 10,000;

$R^5$ is derived from a monohydroxy-terminated alkyl acrylate or methacrylate or a low molecular weight polycaprolactone acrylate.

2. A prepolymer according to claim 1, where $R^3$ is derived from a monohydroxy-terminated polystyrene having a number average molecular weight of about 5,000 to 30,000.

3. A prepolymer according to claim 1, when $R^3$ is derived from a monohydroxy-terminated poly(methyl methacrylate) having a number average molecular weight of about 5,000 to 30,000.

4. A prepolymer according to claim 1, where $R^4$ is derived from a polybutadiene diol having a number average molecular weight of about 800 to 9,000.

5. A prepolymer according to claim 1 where $R^4$ is derived from a polyisoprene diol having a number average molecular weight of about 1,000 to 10,000.

6. A prepolymer according to claim 1 where $R^5$ is selected from the group consisting of hydroxyethyl (meth)acrylate, hydroxypropyl (meth)acrylate, hydroxybutyl (meth)acrylate, hydroxymethyl (meth)acrylate, polycaprolactone acrylate and mixtures thereof.

7. A prepolymer according to claim 1 where $R^4$ is selected from the group consisting of polybutadiene diols having a number average molecular weight of about 800 to 9,000, polyisoprene diols having a number average molecular weight of about 1,000 to 10,000 and mixtures thereof.

8. A prepolymer according to claim 7 where $R^4$ has at least 60% 1,4 microstructure.

9. A prepolymer according to claim 8 where the base polymer is maleated polybutadiene having a number average molecular weight of about 4,000 to 20,000.

10. A prepolymer according to claim 9, where the base polymer has about 8 $R^1$ units per chain and the number average molecular weight is about 8800.

11. A prepolymer according to claim 1, where the base polymer is a maleated butadiene-styrene copolymer having about 5-25% maleic anhydride, about 15-40% styrene, and a number average molecular weight of about 4,000-20,000.

12. A prepolymer according to claim 11, where maleic anhydride is about 10%, styrene is about 30%, and the number average molecular weight is about 4,200.

* * * * *